(12) United States Patent
Furukawa

(10) Patent No.: US 6,282,226 B1
(45) Date of Patent: Aug. 28, 2001

(54) RING CAVITY LASER

(75) Inventor: Yukio Furukawa, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/349,472

(22) Filed: Jul. 9, 1999

(30) Foreign Application Priority Data

Jul. 10, 1998 (JP) .................................................. 10/211977

(51) Int. Cl.$^7$ ................................................... H01S 3/083
(52) U.S. Cl. .............................................................. 372/94
(58) Field of Search .................................... 372/94, 92, 93

(56) References Cited

U.S. PATENT DOCUMENTS

| | | | |
|---|---|---|---|
| 4,578,793 | 3/1986 | Kane et al. | 372/94 |
| 4,818,087 | 4/1989 | Dorschner | 350/622 |
| 5,080,487 | 1/1992 | Martin | 356/350 |
| 5,825,799 | * 10/1998 | Ho et al. | 372/92 |
| 5,878,070 | * 3/1999 | Ho et al. | 372/92 |
| 6,002,704 | * 12/1999 | Freitag et al. | 372/94 |
| 6,009,115 | * 12/1999 | Ho | 372/94 |
| 6,134,257 | * 10/2000 | Capasso et al. | 372/94 |

FOREIGN PATENT DOCUMENTS 0 291 145   1/1988   (EP) .

OTHER PUBLICATIONS

Patent Abstracts of Japan, vol. 016, No. 564 (E–1295, Dec. 4, 1992 & JP 04 216691 A (Sony Corp), Aug. 6, 1992 * abstract *.

Fang, Z J Et al: "An InGaAs–GaAs Trained Layer Single Quantum–Well Ring Laser with a Reactive Ion–Etched Tetragonal Cavity" IEEE Journal of Quantum Electronics, US, IEEE Inc. New York, vol. 31, No. 1, Jan., 1995, pp. 44–48, XP000487605 ISSN:0018–9197 * the whole document *.

U.S. application No. 09/158,820, filed Sep. 23, 1998.
U.S. application No. 09/154,206, filed Sep. 16, 1998.
U.S. application No. 09/067,003, filed Apr. 27, 1998.

* cited by examiner

Primary Examiner—James W. Davie
(74) Attorney, Agent, or Firm—Fitzpatrick, Cella, Harper & Scinto

(57) ABSTRACT

A ring cavity laser has a polyhedral structure contoured by a plurality of planes, and includes a ring cavity having reflective faces formed by the planes of the polyhedral structure, and an active medium. The ring cavity laser is constructed such that there exists a three-dimensional light path among light paths of the ring cavity through which light pumped in the active medium travels when the light starts at a point on one reflective face, is reflected by each reflective face and returns to the starting point.

20 Claims, 12 Drawing Sheets

RING CAVITY LASER

BACKGROUND OF THE INVENTION

1. Field of the Invention

The present invention relates to a laser of a ring cavity (or resonator) type which is usable for optical interconnection, parallel data processing, large-capacity parallel optical transmission and so forth, and particularly to a laser, such as a semiconductor laser, having a three-dimensional ring cavity.

2. Description of the Related Background Art

Semiconductor lasers are well known as light sources which are usable in optical communication and optical recording, and various types thereof have been developed. Further, in recent years, there have been developed opto-electronic integrated circuits in which optical functional devices, such as a semiconductor laser, a photodetector, a modulator and an optical switch, are arranged on a common substrate, and the integration of arrays of semiconductor lasers suitably usable for parallel processing has also been studied. In respect of those integrated circuits, functional improvement of the semiconductor laser is strongly required, and especially a low-threshold semiconductor laser is a key device.

With an approach to such a low-threshold semiconductor laser, a so-called micro-cavity structure is known, whose cavity length is reduced to about a wavelength of light to increase a coupling rate of spontaneous radiation light to its oscillation mode. Devices as illustrated in FIGS. 1, 2A and 2B are known, as examples of such a laser. The device of FIG. 1 is a surface emitting semiconductor laser in which distributed Bragg reflectors 753 and 755 are provided above and under an active layer 751, respectively, a current can be injected into the active layer 751 through upper and lower electrodes 758 and 759, and its cavity is constructed perpendicular to the substrate 757.

The devices of FIGS. 2A and 2B are disc-type semiconductor lasers in which there are arranged discs 873 and 893 having diameters of about several microns and including circular and hexagonal active layers 875 and 895 above substrates 871 and 891, respectively in which and light is totally reflected at peripheral surfaces of those discs 873 and 893, which thus provide ring cavities in planes parallel to the substrates 871 and 891, respectively.

The surface emitting semiconductor laser as illustrated in FIG. 1, however, needs distributed Bragg reflectors with high reflectivity. When a GaAs substrate is used as a substrate, an AlAs/(Al)GaAs multi-layer mirror is ordinarily used as the reflector. In this case, however, more than twenty pairs of AlAs/(Al)GaAs are needed to obtain a sufficiently high reflectivity, and hence it takes much time to grow those pairs on a wafer. Further, when an InP substrate is used, it is necessary to etch the substrate with an active layer and the like grown thereon to form a cylindrical hole in the substrate and to deposit an $SiO_2/Si$ or $Al_2O_3/Si$ multi-layer in the hole by vacuum evaporation or sputtering. The process is hence complicated. In addition, it is difficult to further lower the reduced threshold since light propagating in directions parallel or slanting to the substrate is only weakly coupled to the cavity mode.

On the other hand, in the case of the disc-type semiconductor lasers, the circular disc is ordinarily formed by dry-etching a predetermined portion after the crystalline growth. Therefore, it is difficult to precisely form the circular periphery of the disc's side, and the side face of the active layer is likely to be damaged. In addition, it is also difficult in this case to further lower the reduced threshold since light propagating in directions parallel or slanting to the substrate is not strongly coupled to the cavity mode.

Regarding the case of FIG. 2B, there is indeed a method of forming the hexagonal structure by a selective growth using the face-orientation dependence of crystalline growth speed, and this method can improve the flatness of the side face, compared with dry etching. Also in this case, however, it is likewise difficult to further lower the reduced threshold because light propagating in directions parallel or slanting to the substrate is not strongly coupled to the cavity mode.

Furthermore, in semiconductor lasers which have thus far been developed, oscillation basically occurs in a linearly-polarized light mode, and a semiconductor laser capable of oscillating in a circularly-polarized or elliptically-polarized light mode has not yet been put into practical use.

SUMMARY OF THE INVENTION

An object of the present invention is to provide a ring cavity laser which needs no or only one multi-layer mirror having a high reflectivity, is suitable for a micro-cavity structure, can be readily fabricated, improves a coupling rate of spontaneous radiation light to an oscillation mode, can achieve a low threshold, and is capable of oscillating even with circularly-polarized or elliptically-polarized light.

The present invention is generally directed to a ring cavity laser which has a polyhedral structure contoured by a plurality of planes, includes a ring cavity having reflective faces formed by the planes of the polyhedral structure, and an active medium, and is constructed such that there exists a three-dimensional light path (i.e., one which is not contained in a single plane) among light paths of the ring cavity through which light pumped in the active medium travels when this light starts at a point on one reflective face, is reflected by each reflective face and returns to the starting point. This fundamental structure is capable of increasing a degree of light confinement, enhancing a coupling rate of spontaneous light to its cavity mode, and effecting oscillation even with circularly-polarized or elliptically-polarized light. This leads to a ring cavity laser which can be readily fabricated by using a selective etching method, a selective growth method and the like (which will be described later), and lower its threshold. Since the laser can oscillate with circularly-polarized or elliptically-polarized light, a light source having a strong resistivity to noise, such as returning light, can be built in optical communication systems, for example, when the laser is used as such a light source.

Specifically, the following structures can be adopted based on the above fundamental structure.

The ring cavity can be constructed such that light is totally reflected at at least one reflective point of the plural reflective points in its three-dimensional light path. The ring cavity can be constructed such that light is totally reflected at all the reflective points in its three-dimensional light path. A cavity with little cavity loss can thus be built. Where light is totally reflected at all the reflective points, a cavity with little cavity loss can be constructed without using any multi-layer mirrors.

The polyhedral structure can be a tetrahedron or specifically a regular tetrahedron. More specifically, the polyhedral structure can be formed of a semiconductor of zinc-blende-type crystalline structure. Such a structure can be easily fabricated by using known semiconductor processing techniques.

The semiconductor tetrahedron can include three {111}B faces, three {111}A faces, or three {110} faces. Those configurations can be readily fabricated by a selective growth method using a face-orientation dependence, or a selective etching method using a face-orientation dependence. Accordingly, a polyhedron having flat reflective faces can be easily obtained. Further, a minute tetrahedron can be fabricated.

The polyhedron or tetrahedron can be constructed by performing the selective growth on a substrate having a principal plane of a (111)A face. Semiconductor faces of ($\bar{1}$11)B, (1$\bar{1}$1)B and (11$\bar{1}$)B faces appear during the selective growth. Alternatively, the polyhedron or tetrahedron can be constructed by performing the selective growth on a substrate having a principal plane of a (111)A face. Semiconductor faces of (011), (101) and (110) faces appear during the selective growth. Or, the polyhedron or tetrahedron can be constructed by performing the selective growth on a substrate having a principal plane of a (111)B face. Semiconductor faces of ($\bar{1}$11)A, (1$\bar{1}$1)A and (11$\bar{1}$)A faces appear during the selective growth. Or, the polyhedron or tetrahedron can be constructed by performing the selective growth on a substrate having a principal plane of a (111)B face. Semiconductor faces of (0$\bar{1}$$\bar{1}$), ($\bar{1}$0$\bar{1}$) and ($\bar{1}$$\bar{1}$0) faces appear during the selective growth. The polyhedral ring cavity can be readily fabricated by those selective growths.

The polyhedron or tetrahedron can be constructed by selectively etching a substrate having a principal plane of a (111)B face. Semiconductor faces of ($\bar{1}$11)A, (1$\bar{1}$1)A and (1$\bar{1}$$\bar{1}$)A faces appear during the etching process. The polyhedral ring cavity can also be readily fabricated by this selective etching method.

At least one reflective face of the ring cavity can be formed by a multi-layer reflector. More specifically, this film may be a semiconductor multi-layer reflector or a dielectric multi-layer reflector. A reflective face having a high reflectivity can thus be formed, and hence losses in the cavity can be reduced. The polarization state of an oscillation mode can be set by using the fact that a phase shift in reflection at the multi-layer is zero. Further, where the semiconductor multi-layer reflector is used, a reflective face on the substrate can be readily obtained since this semiconductor reflector can be formed during a crystal growth process on the substrate.

The polyhedral ring cavity can be formed on a semiconductor substrate. In this case, side faces other than a bottom face of the polyhedron can be covered with a buried material whose index of refraction is smaller than that of semiconductor of the ring cavity such that the total reflection condition can be met. When an electrode for injecting a current into the active medium is formed, unwanted extension of the electrode onto a semiconductor slant portion can be suppressed due to the presence of the buried material. Losses on the slant portion at the time of reflection can thus be eliminated.

The polyhedral ring cavity can be formed on a semiconductor substrate which has a face inclining toward a predetermined direction by a predetermined angle from a (111)A or (111)B face. Since the shape of the polyhedron or tetrahedron can be appropriately set in such a structure, a readily oscillating cavity mode and the polarization state of an oscillating mode can be properly determined.

The principle of the present invention will be described using a tetrahedron ABCD shown in FIGS. 3A–3D. The tetrahedron includes a-, b-, c- and d-faces. There is a light path through which light starting at a point L on the a-face is reflected at a point M on the d-face, at a point N on the b-face and at a point P on the c-face, and returns to the point L. When the tetrahedron ABCD is a regular tetrahedron, the incident angle of the light on each face is 39.23°. Where the tetrahedron ABCD is immersed in air, whose index of refraction is 1 (one), the light will be totally reflected on each face of the tetrahedron, as is known from the well-known Snell's law, provided that the material of the tetrahedron ABCD has an index of refraction (n) more than 1.58 (n>1.58). Since power reflectance upon total reflection is 100%, the reflection is accompanied by no loss. A cavity with little cavity loss can thus be constructed without needing any special multi-layer mirrors.

A complete establishment of the cavity requires satisfaction of another condition, that the returning light should have the same polarization state as that of the original light.

In accordance with a p-directional (parallel to the incident plane) and an s-directional (normal to the incident plane) on each reflection face, the electric field of light is separated into a p-component (its field component is parallel to the incident plane) and an s-component (its field component is normal to the incident plane). Here, a phase-shift amount occurring at the time of total reflection will be considered.

$$\begin{pmatrix} E'_p \\ E'_s \end{pmatrix} = \exp(-jkL) \cdot M \begin{pmatrix} E_p \\ E_s \end{pmatrix} \quad (1)$$

where $E_p$ and $E_s$ are p- and s-components of the electric field of light incident on the point L on the a-face, respectively, $E_p'$ and $E_s'$ are p- and s-components of the electric field of light returning to the point L after one round, respectively, M is a phase-shift matrix representing phase shifts which light receives on the respective faces during one round of the light path, L is the length of the cavity, $k=2N\pi/\lambda$, N is the index of refraction of the tetrahedron, and $\lambda$ is the wavelength of the light. The phase-shift matrix M is a product of a matrix representing phase shifts received by p- and s-components at the time of reflection on each face and a matrix representing conversions between p- and s-directions in the path from one face to the next face.

In relation (1), an eigenvalue $\sigma_0$ and an eigenvector having a p-component of $E_{p0}$ and an s-component of $E_{s0}$ exist without exception, and satisfy:

$$M \begin{pmatrix} E_p \\ E_s \end{pmatrix} = \delta \begin{pmatrix} E_p \\ E_s \end{pmatrix} \quad (2)$$

Provided that no loss is present (this assumption does not impair generality and is permissible because, even if there is actually some loss, a gain compensating for this loss can be given), the determinant of the phase-shift matrix M is 1 (one) and the eigenvalue $\sigma_0$ thereof is a complex quantity whose absolute value is 1 (one) (i.e., exp(±pure imaginary number).

Accordingly, a wavelength $\lambda_0$ exists, which satisfies:

$$\exp(-jkL) \cdot \sigma = 1 \, (k = 2N\pi/\lambda) \quad (3).$$

Then, relation (2) becomes:

$$\frac{E'_p}{E'_s} = \frac{E_{p0}}{E_{s0}}, \quad (4)$$

and hence light returns to the original point with the same polarization state as that of the original light, leading to the establishment of the light path of the cavity.

As a result, light of the wavelength $\lambda_0$ having the polarization state which satisfies the above eigen-vector at the point L, satisfies the resonance condition and oscillates. This polarized light is generally elliptically-polarized or circularly-polarized light both components of which have non-zero amplitudes, and have a certain phase difference therebetween.

Since the matrix M is a 2×2 matrix, there normally exist two eigenvalues. Those correspond to right-handed and left-handed elliptically polarized light, respectively.

Thus, elliptically-polarized light can be lased in the thus-constructed three-dimensional ring cavity. It is also possible to lase circularly-polarized or linearly-polarized light when the phase-shift amount at the time of reflection is regulated by controlling an index difference and a structure at the interface of the reflective face, or when the shape of the tetrahedron is controlled (e.g., a regular tetrahedron or a predetermined tetrahedron is built), or when another polyhedron is used.

In the above description, description is made using the light path having reflection points on the a-, d-, b-, c- and a-faces in this order, but the light path may have other routes. For example, there are light paths having reflection points on the a-, c-, b-, d- and a-faces (a reverse route); the a-, b-, c-, d- and a-faces; and the a-, c-, d-, b- and a-faces. Further, light may be reflected twice or more on the same face in a cavity. A cavity mode having a minimum threshold dominantly oscillates among those plural cavities. Such a cavity mode is generally present in the structure of this invention. In addition, a readily lasing cavity mode can be specifically determined by appropriately defining the shape of the cavity (e.g., shaping the cavity into a tetrahedron other than a regular tetrahedron).

In the structure of this invention, since light travelling slantingly relative to the substrate is also confined in the polyhedron or tetrahedron due to the total reflection, the coupling rate of spontaneous radiation light to the cavity mode can be drastically enhanced.

Regarding fabrication methods of the polyhedron or tetrahedron, there are a selective growth method using the face-orientation dependence, and a selective etching method using the face-orientation dependence. A sufficiently flat face can be obtained by those methods, as compared with fabrication by dry etching. Further, since this invention makes it easy to fabricate a polyhedron or tetrahedron with sides of about several microns, a micro-cavity structure can be readily formed.

The fabrication method of a tetrahedral structure will be described using an example wherein crystal is grown on a GaAs substrate by MOCVD.

When GaAs is grown on a {111}A face, an As atom on an uppermost face is bonded to a Ga atom on a plane next to the uppermost face with one bond. Therefore, the stability of As atoms on the uppermost face is low, so growth occurs only when a large amount of As is supplied. That is, the growth rate increases when the temperature is low and a V/III supply ratio (the ratio of the supply amount of semiconductor V to the supply amount of semiconductor III) is large.

On the other hand, the number of bonds is three on a {111}B face. Therefore, the stability of As atoms on the uppermost face is high, so the growth rate increases as the temperature rises and the V/III supply ratio decreases, conversely to the case of the {111}A face.

The tetrahedral structure can be formed by using his difference in the growth rate. For example, a mask or the selective growth, which has a window of a regular triangle having three sides extending in the <0$\bar{1}$1>, <10$\bar{1}$> and <$\bar{1}$10> directions, is formed on a substrate with a (111)B face, and crystal is grown under conditions of a high temperature and a small V/III supply ratio. Then, since little growth of a {111}A face occurs, a triangular cone can be formed with (1$\bar{1}\bar{1}$)A, ($\bar{1}$1$\bar{1}$)A and ($\bar{1}\bar{1}$1)A as terminal faces. The tetrahedral structure can be completed by removing the substrate from its bottom by etching.

Further, for example, a mask for the selective growth, which has a window in the shape of an equilateral triangle having three sides extending in the <0$\bar{1}$1>, <10$\bar{1}$> and <$\bar{1}$10> directions, is formed on a substrate with a (111)A face, and crystal is grown under conditions of a low temperature and a large V/III supply ratio. Then, since little growth of a {111}B face occurs, a triangular cone can be formed with ($\bar{1}$11)B, (1$\bar{1}$1)B and (11$\bar{1}$)B as terminal faces.

A tetrahedron can be formed by using a difference in the growth rate between a {011} face and a {111}A or {111}B face. When the substrate face is a complete {111} face, a regular tetrahedron can be formed. Furthermore, when a so-called off substrate, in which a face orientation is shifted by a predetermined angle, is used, the shape of the tetrahedron can be controlled.

Regarding the selective etching method using the face-orientation dependence, when etching is performing using an etching liquid, such as $Br_2$—$C_2H_5OH$, a tetrahedron can be formed since the etching rate of a {111}A face is quite low.

These advantages and others will be more readily understood from the following detailed description of the preferred embodiments in conjunction with the drawings.

DESCRIPTION OF THE PREFERRED EMBODIMENTS

First Embodiment

A first embodiment will be described with reference to FIGS. 4 and 5A–5E. A fabrication method of this embodiment will initially be described.

Figure 5A:
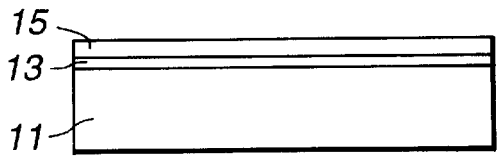
FIGS. 5A to 5E are cross-sectional views for explaining a fabrication process of the first embodiment.
Figures 1, 5B:
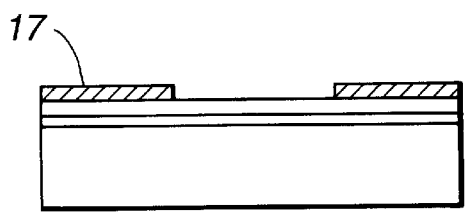

An n-AlAs etching stop layer 13 having a thickness of 0.2 μm, and an n-Al$_{0.2}$Ga$_{0.8}$As clad layer 15 having a thickness of 1.0 μm are serially grown on an n-GaAs substrate 11 having a (111)B face, using an MOCVD method (see FIG. 5A).

Figure 1:
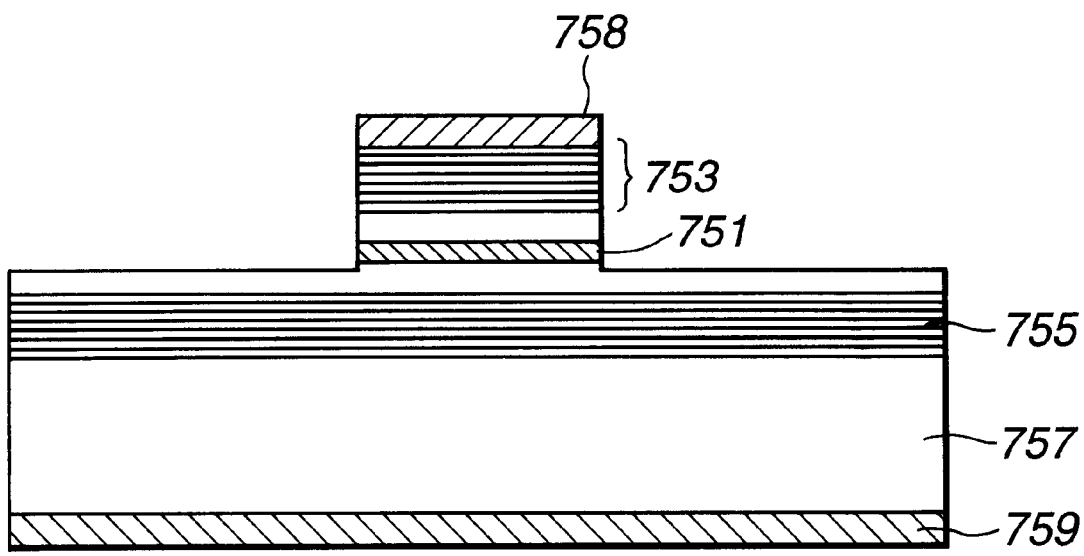
FIG. 1 is a cross-sectional view of a prior-art surface emitting semiconductor laser.
Figure 2A:
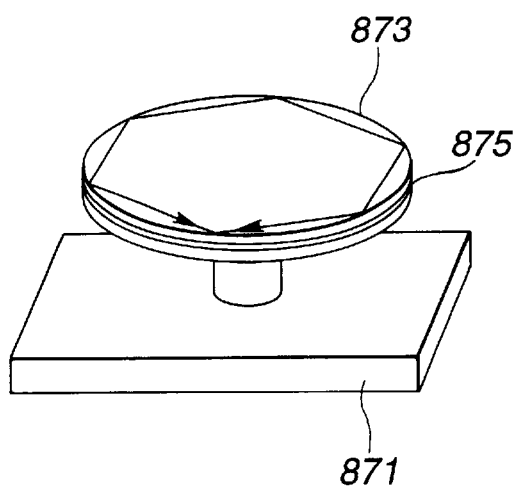
FIGS. 2A and 2B are perspective views illustrating prior-art disc-type semiconductor lasers, respectively.
Figure 2B:
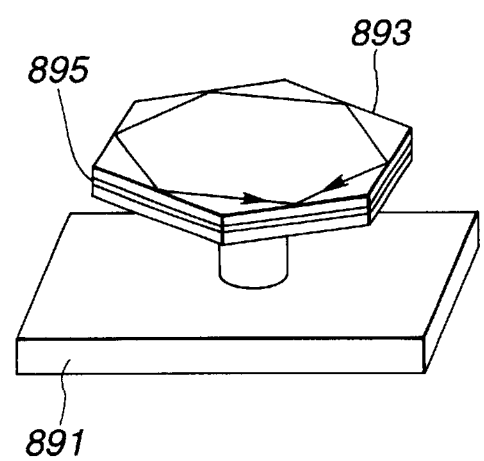
Figure 3A:
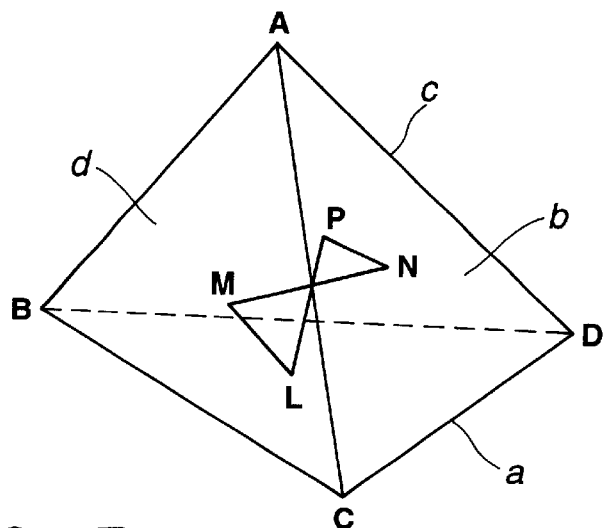
FIGS. 3A–3D are views illustrating a ring cavity laser constructed according to the present invention.
Figure 3B:
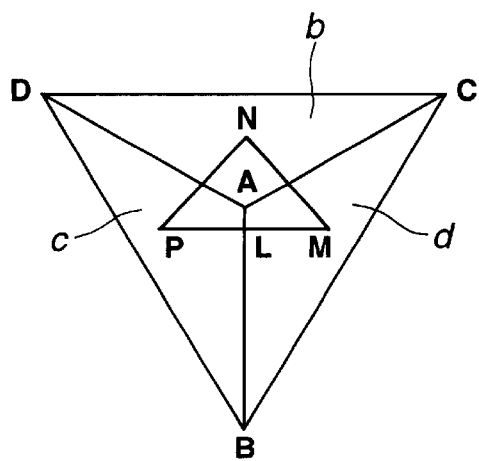
Figure 3C:
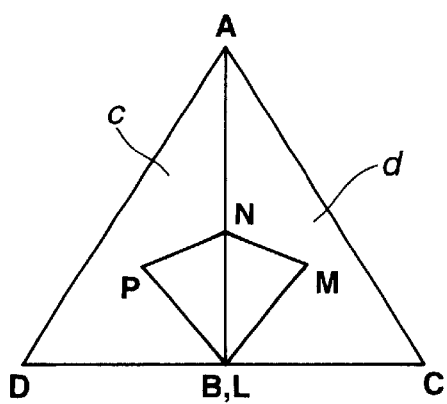
Figure 3D:
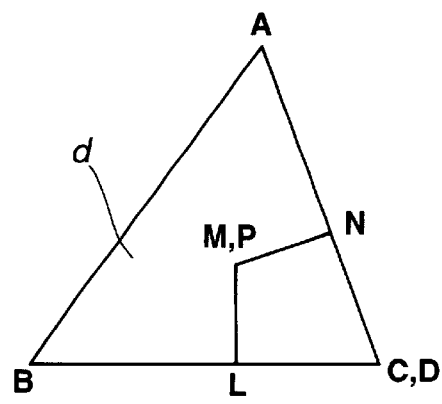
Figure 4:
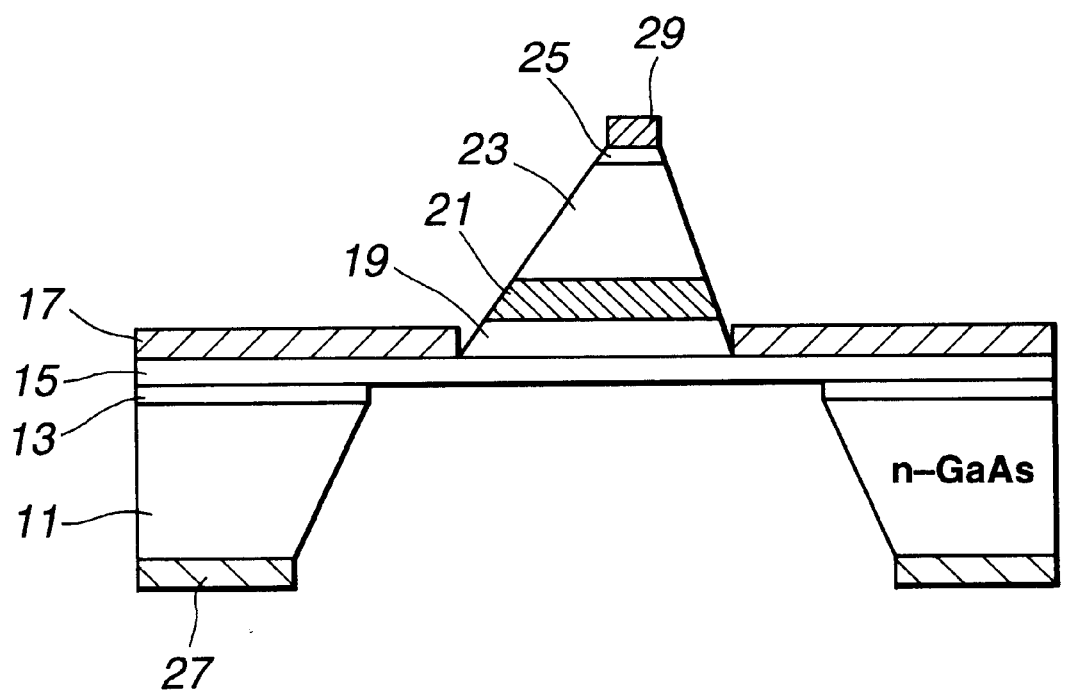
FIG. 4 is a cross-sectional view of a first embodiment of a ring cavity laser according to the present invention.
Figures 2, 5B:
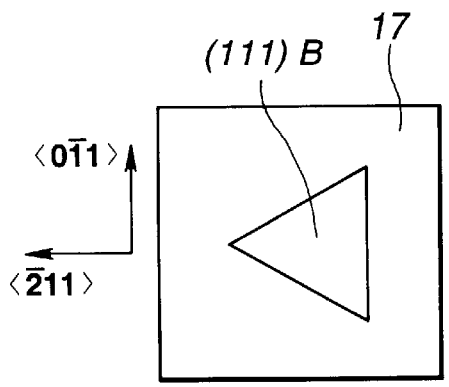
Figures 1, 5C:
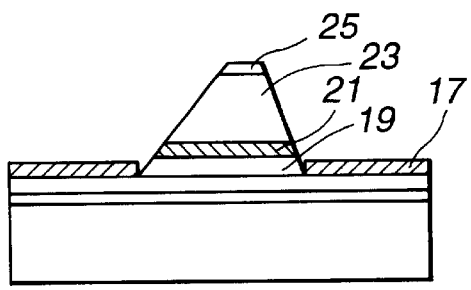
Figures 2, 5C:
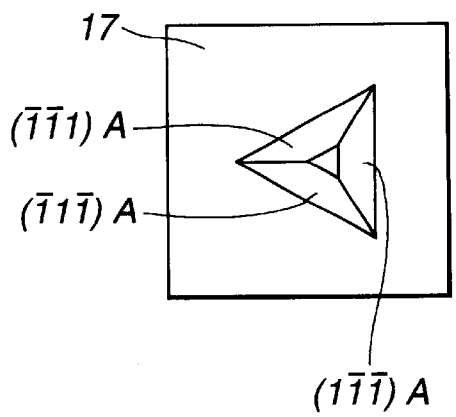

Then, after SiO$_2$ is deposited over the wafer using a sputtering method or the CVD method, a window of an equilateral triangle having three sides extending in <0$\bar{1}$1>, <10$\bar{1}$>and <$\bar{1}$10>directions is formed in the SiO$_2$ by etching to form a mask 17 for the selective growth. The length of each side of the equilateral triangle is 5 μm (see FIGS. 5B-1 and 5B-2).

Further, an n-Al$_{0.2}$Ga$_{0.8}$As clad layer 19 having a thickness of 1.0 μm, an n-GaAs active layer 21 having a thickness of 0.2 μm, a p-Al$_{0.2}$Ga$_{0.8}$As clad layer 23 having a thickness of 2.0 μm, a p-Al$_{0.3}$Ga$_{0.7}$As contact layer 25 having a thickness of 0.3 μm are serially grown under conditions of a low temperature and a large V/III supply ratio. Under those conditions, since the growth rate of a {111}A face is much smaller that that of a {111}B face, a triangular cone can be formed with (1$\bar{1}\bar{1}$)A, ($\bar{1}$1$\bar{1}$)A and ($\bar{1}\bar{1}$1)A as terminal faces (see FIGS. 5C-1 and 5C-2).

Figure 5D:
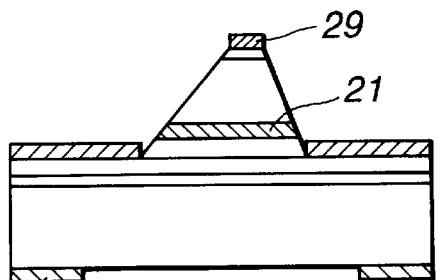
Figure 5E:
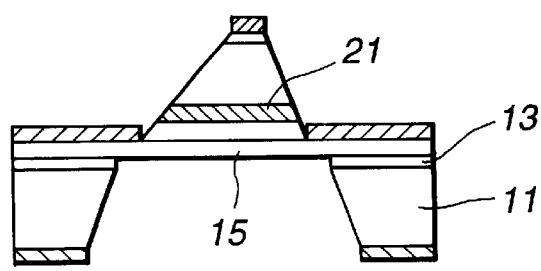

Then, an n-side annular electrode 27 is formed on the bottom face of the substrate 11, and a p-side electrode 29 is formed on the top contact layer 25 (see FIG. 5D).

Finally, the substrate 11 is wet-etched from its bottom face with an etching liquid of ammonia plus hydrogen peroxide series, and the etching stop layer 13 is etched with hydrofluoric acid. The clad layer 15 is thus exposed to be a reflective face (see FIG. 5E).

The thus-fabricated ring cavity semiconductor laser has a light path in a three-dimensional ring cavity as illustrated in FIGS. 3A–3D. The incident angle on each face is 39.23°. This value meets the total reflection condition at the interface between the semiconductor (its index of refraction is about 3.2) and air. A cavity with low loss can thus be built without using any multi-layer mirrors as used in the surface emitting semiconductor laser.

In the above structure, light travelling slantingly relative to the substrate 11 is also confined in the tetrahedral cavity due to the total reflection at each face thereof, which drastically increases a coupling rate of spontaneous radiation light generated in the active layer 21 to the cavity mode. As a result, a threshold current of the laser can be reduced below 1 mA.

In this embodiment, light scattering occurs at the interface between the semiconductor and the p-side electrode 29 for supplying current to the active layer 21. Laser light leaking outside thereat could be observed. In observing the polarization state of this laser light, it was confirmed that the light was elliptically-polarized light.

In respect of the method of picking out the light, in addition to using such scattering, evanescent light created near the reflective face at the time of total reflection can also be used by coupling it to an exterior waveguide, such as an optical fiber.

The substrate having the (111)B face is used in this embodiment, but a (111)A face can likewise be used. In this case, the selective growth is performed under the condition that the growth rate of the {111}B face is much smaller than that of the {111}A face, i.e., under a low temperature and a small V/III supply ratio. Thus, a tetrahedron having a side of the {111}B face can be formed.

Second Embodiment

The substrate having the (111)B face is used in the first embodiment, but crystal can also be grown using a so-called off substrate. In a second embodiment, crystal is grown on a (111)B substrate whose face is inclined seven degrees toward a <2$\bar{1}\bar{1}$>direction, and a ring cavity semiconductor laser is thus fabricated. Its growth method and so forth are substantially the same as those used in the first embodiment.

In the first embodiment, since the cavity has the regular tetrahedral structure, there are three light paths in the ring cavity which are mutually in a triple symmetrical relation about a normal to the substrate 11. Each of the three light paths has forward and reverse directions. Consequently, when current sufficiently larger than the threshold is injected into the active layer 21, the scattering light generated at the interface between the semiconductor and the electrode 29 has an intensity distribution which has directivities in six directions.

In contrast, the scattering light has two directivities (forward and reverse directions in the same light path) in the second embodiment. The symmetry of the tetrahedron can be eliminated by inclining the substrate face. As a result, possible ring cavities can be differentiated with respect to their thresholds, and a most-readily lasing cavity mode can thus be determined.

Third Embodiment

In the first embodiment the tetrahedral cavity is formed by using the selective growth. However, a polyhedron can be formed by a selective etching using the face-orientation dependence likewise. A third embodiment is directed to such a structure. FIGS. 6A–6E illustrate respective steps of a fabrication method of a ring cavity semiconductor laser of this embodiment. The fabrication method will be described.

Figure 6A:
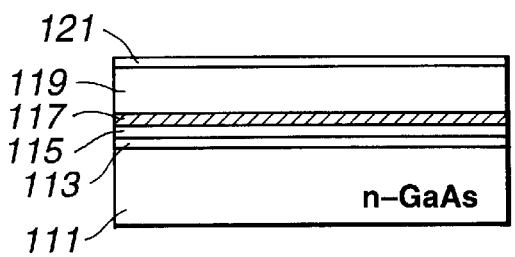
FIGS. 6A to 6E are cross-sectional views for explaining a fabrication process of a third embodiment of a ring cavity laser according to the present invention.
Figures 1, 6B:
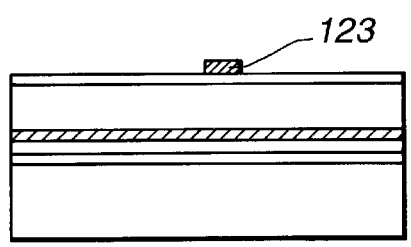
Figures 2, 6B:
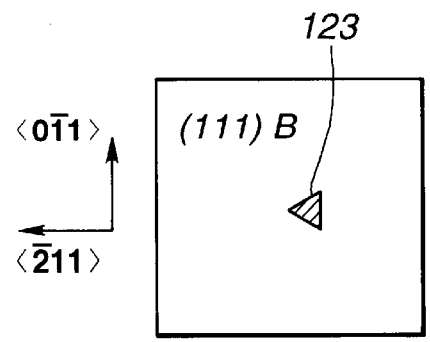
Figures 1, 6C:
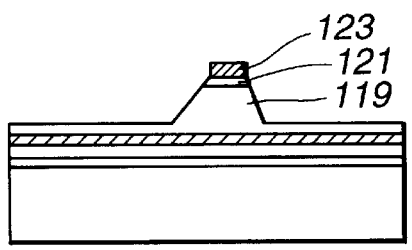
Figures 2, 6C:
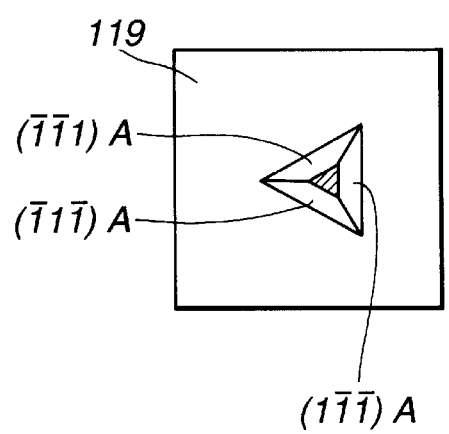

An n-AlAs etching stop layer 113 having a thickness of 0.2 μm, an n-Al$_{0.2}$Ga$_{0.8}$As clad layer 115 having a thickness of 1.0 μm, a GaAs active layer 117 having a thickness of 0.2 μm, a p-Al$_{0.2}$Ga$_{0.8}$As clad layer 119 having a thickness of 4.0 μm, and a p-Al$_{0.3}$Ga$_{0.7}$As contact layer 121 having a thickness of 0.3 μm are serially grown on an n-GaAs substrate 111 having a (111)B face, using the MOCVD method (see FIG. 6A).

Then, after SiO$_2$ is deposited over the wafer using the sputtering method or CVD method, surroundings of an equilateral triangle having three sides extending in <0$\bar{1}$1>, <10$\bar{1}$>and <$\bar{1}$10>directions is defined by etching to form a mask 123 for further etching. The length of each side of the equilateral triangle is 2 μm (see FIGS. 6B-1 and 6B-2).

Then, the clad layer 119 and the contact layer 121 are etched by using a Br$_2$—C$_2$H$_5$OH etching liquid. In this etching, since the etching rate of a {111}A face is quite low, a triangular cone can be formed with terminal (1$\bar{1}\bar{1}$)A, ($\bar{1}$1$\bar{1}$)A and ($\bar{1}\bar{1}$1)A as terminal faces (see FIGS. 6C-1 and 6C-2).

Figure 6D:
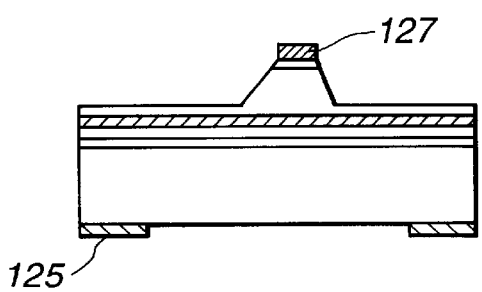
Figure 6E:
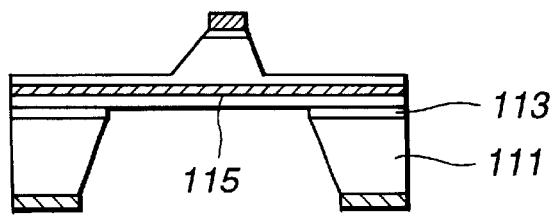

Then, after the mask 123 is removed, an n-side annular electrode 125 is formed on the bottom face of the substrate 111, and a p-side electrode 127 is formed on the top contact layer 121 (see FIG. 6D).

Finally, the substrate 111 is wet-etched from its bottom face with an etching liquid of ammonia plus hydrogen peroxide series, and the etching stop layer 113 is etched with hydrofluoric acid. The clad layer 115 is thus exposed to be a reflective face (see FIG. 6E).

In this embodiment, since the reflective face is formed by etching having face-orientation dependence, reflective faces with smaller loss than that formed by dry etching such as RIE, can be formed. Compared with the first embodiment, the process of the third embodiment is simplified, since only one crystalline growth is needed. As for the other features, the third embodiment is the same as the first embodiment.

Fourth Embodiment

Figure 7:
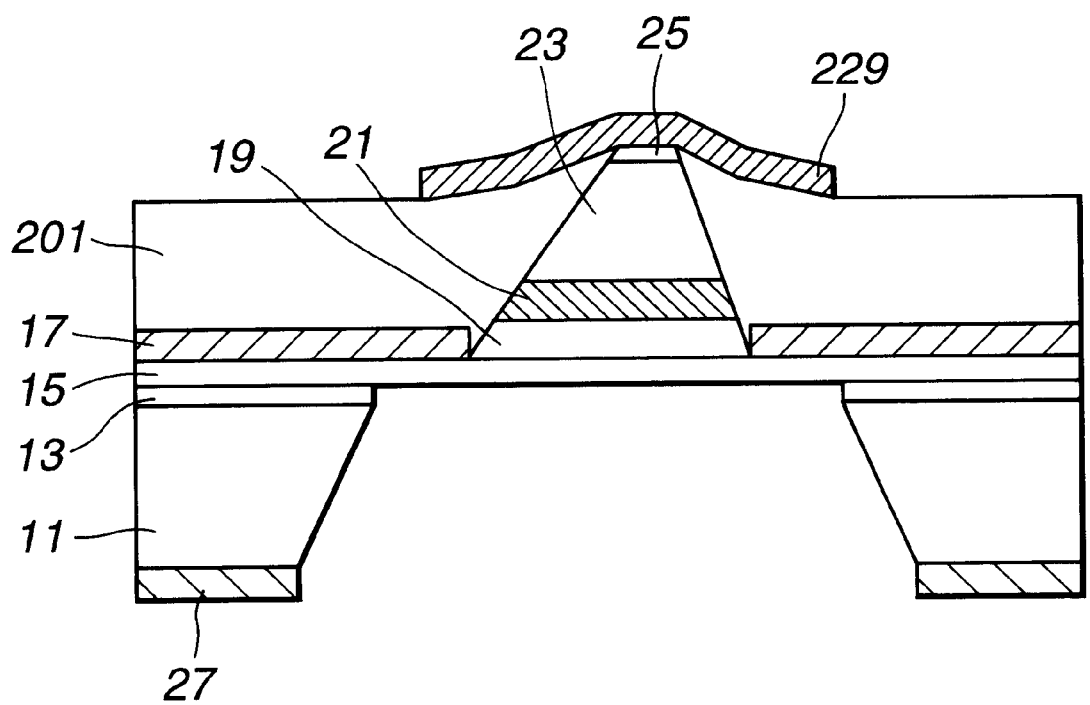
FIG. 7 is a cross-sectional view of a fourth embodiment of a ring cavity laser according to the present invention.

A fourth embodiment will be described with reference to FIG. 7, which shows a cross-section of a ring cavity semiconductor laser of this embodiment.

The fourth embodiment differs from the first embodiment in that slant side faces of a semiconductor tetrahedron is covered with insulating material. The semiconductor layer structure and so forth of the fourth embodiment are substantially the same as those of the first embodiment. In FIG. 7, the same functional layers as those of the first embodiment are denoted by the same reference numerals as those in FIG. 4.

In the fourth embodiment, a buried layer 201 is formed of $Al_2O_3$ deposited by the sputtering method. In this case, the index of refraction of $Al_2O_3$ is normally about 1.62, so the incident angle of 39.23° satisfies the total reflection condition. Therefore, the light confinement of this embodiment is as good as the first embodiment. The cavity loss is thus little, and hence a ring cavity semiconductor laser with low threshold can be achieved.

Further, a difference in the index of refraction can be controllably changed between the cavity semiconductor and the buried layer 201 by selecting the material of the buried layer 201. The phase at the time of total reflection is accordingly varied, so that a degree of elliptical polarization in oscillation can be controlled.

In this embodiment, since the buried layer 201 is provided, a p-side electrode 229 can be deposited over the top portion of the cavity and the buried layer 201. No special patterning process is hence needed to form the electrode 229. Moreover, reflection loss at the semiconductor slant face due to unwanted extension of the electrode thereto can be eliminated.

Further, when the p-side of this embodiment is bonded to a heat sink with solder or the like to form a thermal radiation mechanism, unwanted extension of the solder to the reflective face can be prevented by the burying layer 201. The fabrication can thus be facilitated. In addition, since most of the p-side can be bonded to the heat sink, radiation efficiency can be increased. Furthermore, thermal conductivity of $Al_2O_3$ is great, so the radiation efficiency can be further improved. Regarding the buried material, $SiO_2$, $SiN_x$, AlN, MgO or polyimide can also be used in place of $Al_2O_3$, for example. Materials having a large thermal conductivity are naturally preferable to obtain a better effect.

Fifth Embodiment

Figure 8:
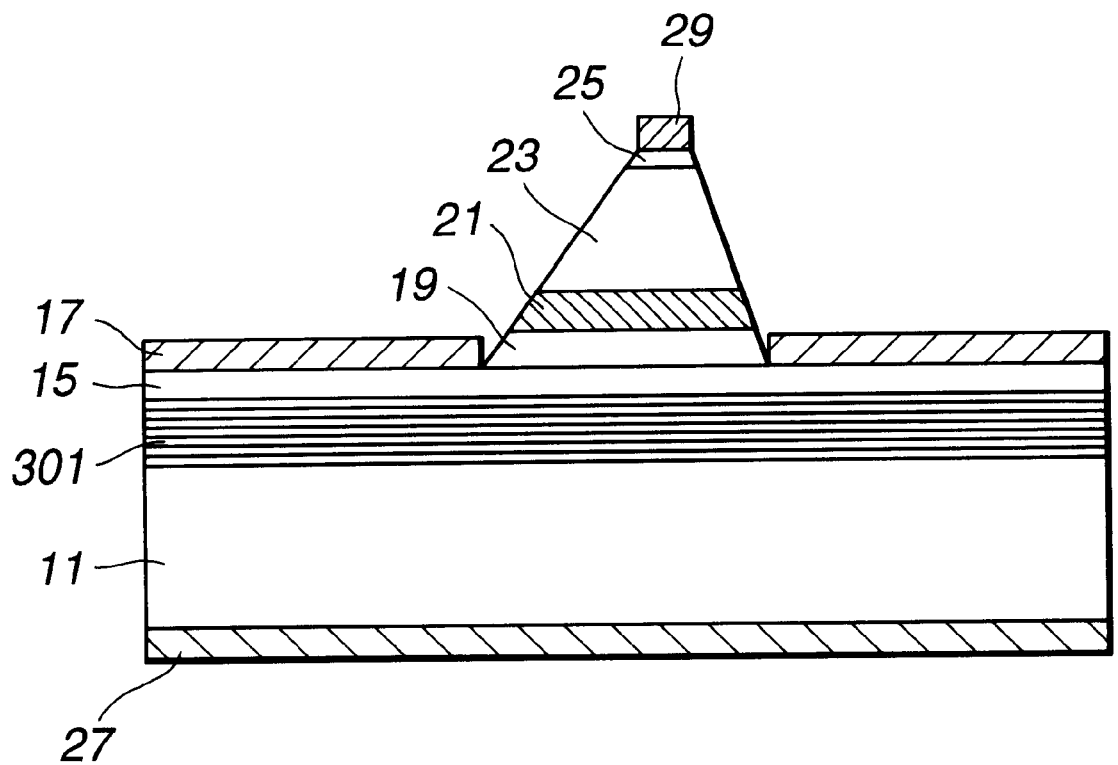
FIG. 8 is a cross-sectional view of a fifth embodiment of a ring cavity laser according to the present invention.

A fifth embodiment will be described with reference to FIG. 8, which shows a cross-section of a ring cavity semiconductor laser of this embodiment.

The fifth embodiment differs from the first embodiment in that a semiconductor multi-layer mirror 301 of AlAs/GaAs is provided between the substrate 11 and the clad layer 15 while no etching stop layer is provided. The semiconductor layer structure and so forth of the fifth embodiment are substantially the same as those of the first embodiment. In FIG. 8, the same functional layers as those of the first embodiment are denoted by the same reference numerals as those in FIG. 4.

In the fifth embodiment, etching of the substrate performed in the first embodiment is not needed, so fabrication is further facilitated.

Further, since reflection by the multi-layer mirror is different from the total reflection at the interface between semiconductor and air and is not accompanied by a phase shift, oscillation in an elliptical polarization mode, which differs from that in the first embodiment, can be obtained.

Sixth Embodiment

The ring-cavity light path formed in the tetrahedron can have various patterns. This fact will be described with reference to FIGS. 9A–9D which are respectively perspective, plan, front and side views showing different aspects of a ring cavity. In this case, a plurality of reflections occur on a curtain face during one round of the ring cavity.

Light starting at a point E on an a-face is reflected at a point F on a d-face and returns to the a-face again. The light is then serially reflected at a point H on the a-face, at a point I on a b-face, at a point J on the a-face, and at a point K on a c-face, and again returns to the point E. Here, the incident angle of the light is 28.56° on the side face, while it is 72.28° on the bottom face. When the polyhedral cavity is formed of semiconductor whose index of refraction is about 3.2, the total reflection condition is satisfied, and a cavity with little cavity loss can hence be constructed.

Figure 9A:
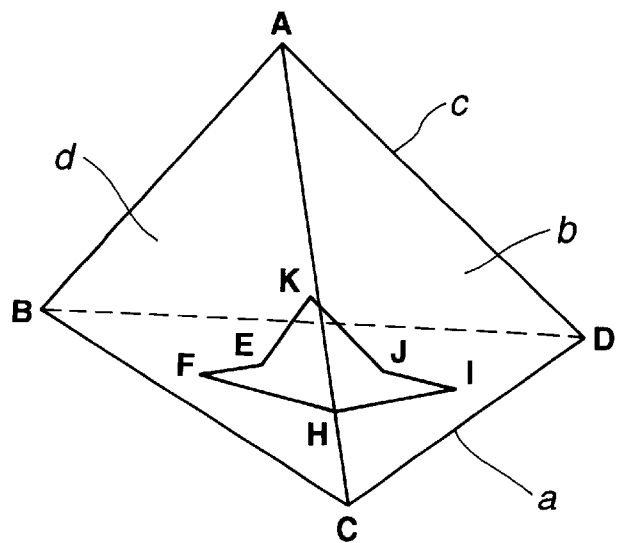
FIGS. 9A–9D are views illustrating a ring cavity laser constructed according to the present invention, respectively.
Figure 9B:
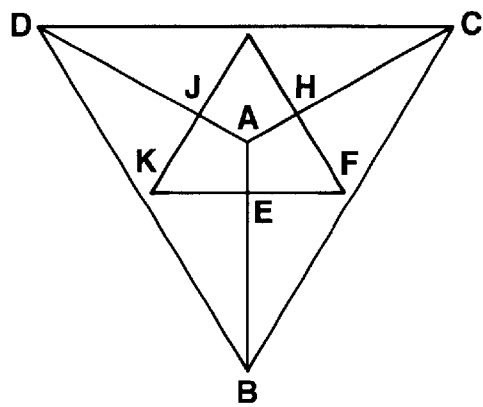
Figure 9C:
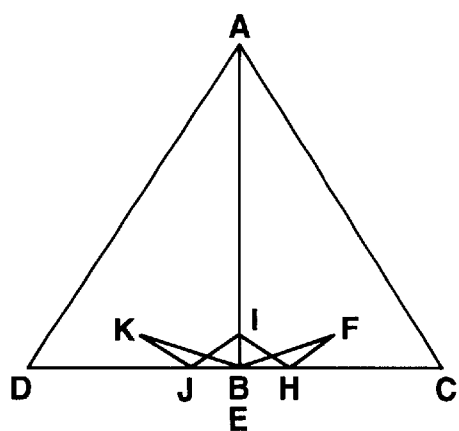
Figure 9D:
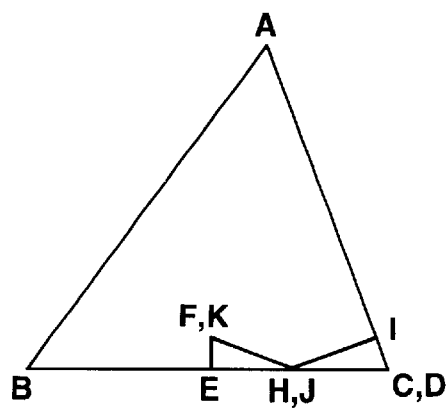

As is apparent from FIGS. 9C and 9D, light is concentrated near the a-face in this case. Therefore, when an active layer is provided near the a-face, light can be dominantly oscillated in the above cavity mode.

Figure 10:
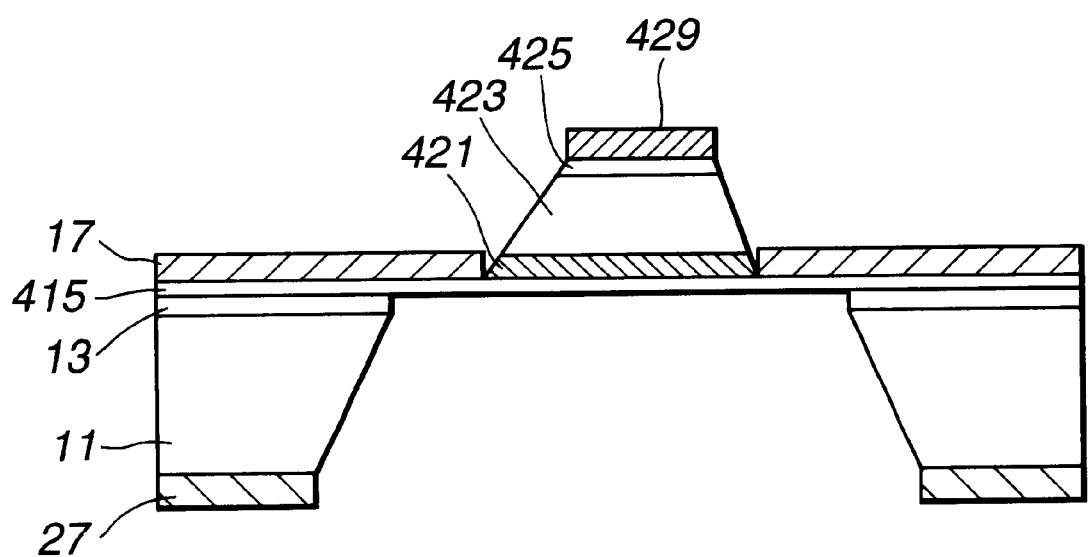
FIG. 10 is a cross-sectional view of a sixth embodiment of a ring cavity laser according to the present invention.
Figure 11A:
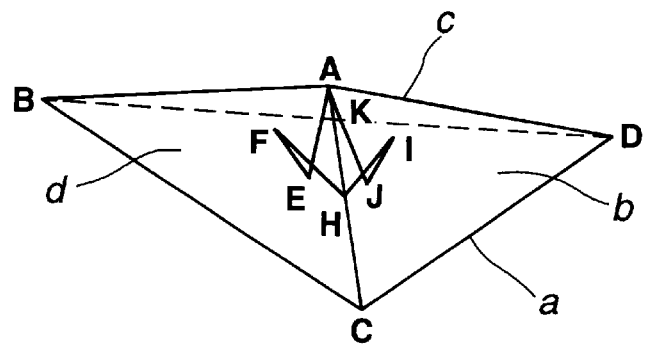
FIGS. 11A–11D are views illustrating a ring cavity laser constructed according to the present invention, respectively.
Figure 11B:
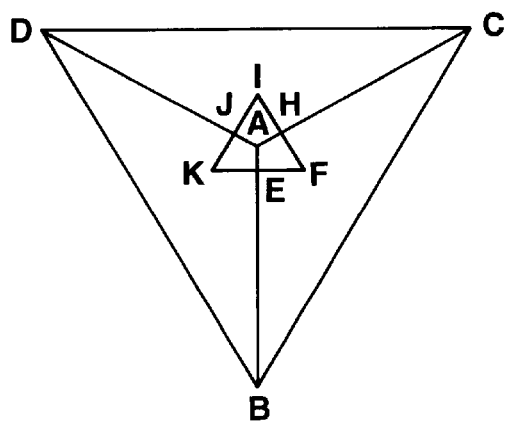
Figure 11C:
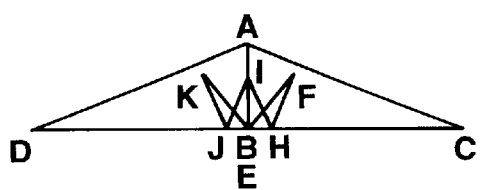
Figure 11D:
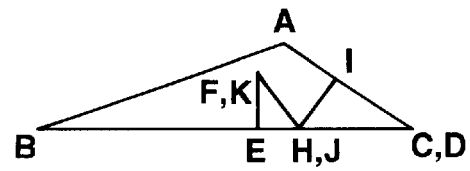

Such an example is illustrated in FIG. 10 which shows a cross section of a ring cavity semiconductor laser of the sixth embodiment.

The semiconductor layer structure and so forth of the sixth embodiment are substantially the same as those of the first embodiment. In FIG. 10, the same functional layers as those of the first embodiment are denoted by the same reference numerals as those in FIG. 4.

In this embodiment, to locate an active layer 421 near a reflective face on the substrate side, a clad layer 415 is made thinner than that of the first embodiment and the active layer 421 is formed directly on the thin clad layer 415 during the selective growth without interposing a clad layer.

Little light is present in an upper portion of the tetrahedron in this embodiment. Therefore, the thickness of a clad layer 423 can be reduced, so that the growth time can be shortened, as compared with the first embodiment. Further, since the area of a contact layer 425 can be expanded, a p-side electrode 429 can be further facilitated and its contact resistance can be lowered.

Thus, in the sixth embodiment, the position of the active layer in the tetrahedron is changed in the above manner, so oscillation can be further efficiently effected in a cavity mode different from that of the first embodiment.

Seventh Embodiment

Figure 12:
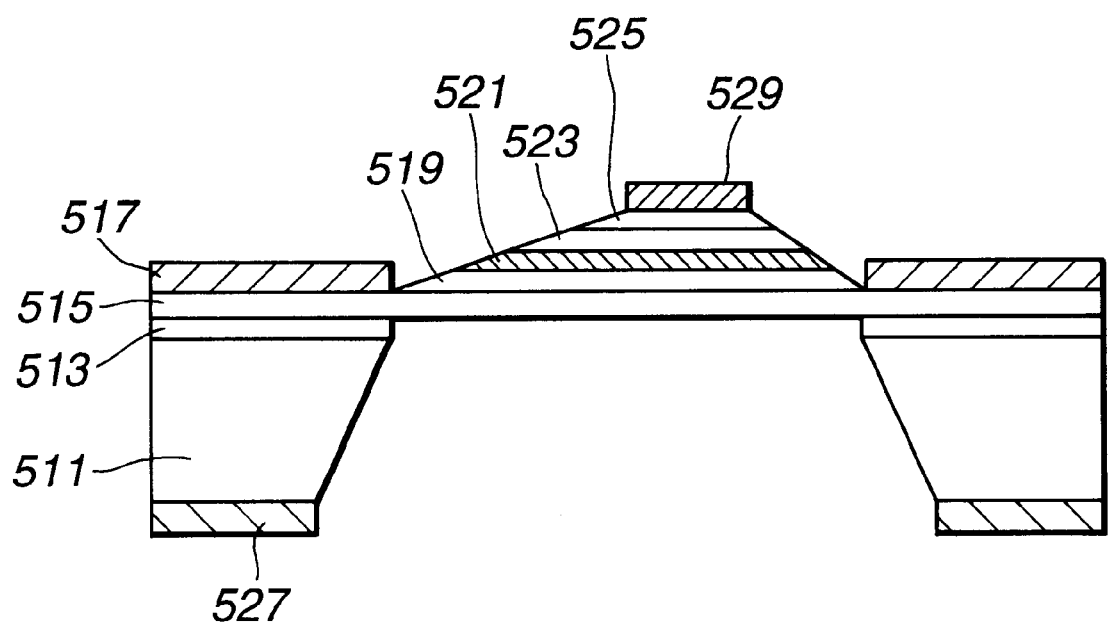
FIG. 12 is a cross-sectional view of a seventh embodiment of a ring cavity laser according to the present invention.

In the above embodiments, three side faces of the tetrahedron are {111}A faces or {111}B faces. Side faces, however, are not limited to these. For example, {011} faces are possible. FIGS. 11A–11D and 12 illustrate such an example. FIGS. 11A–11D are respectively perspective, plan, front and side views showing different aspects of a ring cavity. FIG. 12 illustrates a cross-section of a ring cavity semiconductor laser of the seventh embodiment.

A fabrication method of this embodiment will be initially described with reference to FIG. 12. The fabrication method is substantially the same as that of the first embodiment.

An n-AlAs etching stop layer 513 having a thickness of 0.2 $\mu$m, and an n-Al$_{0.2}$Ga$_{0.8}$As clad layer 515 having a thickness of 1.0 $\mu$m are serially grown on an n-GaAs substrate 511 having a {111}B face, using the MOCVD method.

Then, after SiO$_2$ is deposited over the entire wafer using the sputtering method or CVD method, a window having the shape of an equilateral triangle whose three sides extend in <0$\bar{1}$1>, <10$\bar{1}$> and <$\bar{1}$10> directions is formed in the SiO$_2$ by etching to form a mask 517 for the selective growth.

Further, an n-Al$_{0.2}$Ga$_{0.8}$As clad layer 519 having a thickness of 0.5 $\mu$m, a GaAs active layer 521 having a thickness of 0.2 $\mu$m, a p-Al$_{0.2}$Ga$_{0.8}$As clad layer 523 having a thickness of 1.0 $\mu$m, and a p-Al$_{0.3}$Ga$_{0.7}$As contact layer 525 having a thickness of 0.3 $\mu$m are serially grown on conditions of a low temperature and a large V/III supply ratio. Under those conditions, the growth rate of a {111}B face is large.

In this embodiment, different from the first embodiment, the growth condition is so selected that the growth rate of the {111}A face is larger than that of the {011} face. As a result, a triangular cone with three {011} faces as terminal faces, i.e., (0$\bar{1}\bar{1}$), ($\bar{1}$0$\bar{1}$) and ($\bar{1}\bar{1}$0) faces, can be formed.

Then, an n-side annular electrode 527 is formed on the bottom face of the substrate 511, and a p-side electrode 529 is formed on the top contact layer 525.

Finally, the substrate 511 is wet-etched from its bottom face with an etching liquid of ammonia plus hydrogen peroxide series, and the etching stop layer 513 is etched with hydrofluoric acid. The clad layer 515 is thus exposed to be a reflective face.

The thus-fabricated ring cavity will be described with reference to FIGS. 11A–11D. Light starting at a point E on an a-face is reflected at a point F on a d-face, and returns to the a-face. The light is then reflected at a point H on the a-face, at a point I on a b-face, at a point J on the a-face and at a point K on a c-face, and again returns to the point E. Thus, the cavity is established.

Here, the incident angles on each side face and the bottom face are respectively 18.43° and 39.23°, and those values satisfy the total reflection condition when the polyhedral cavity is composed of semiconductor whose index of refraction is about 3.2. A cavity with low loss can thus be built.

In this embodiment, the layer thickness of the selective growth can be smaller than that of the first embodiment. Further, in this embodiment, oscillation can be effected in a cavity mode different from that of the first embodiment by changing the shape of the tetrahedron. Further, in this embodiment, a triangular cone with three {011} faces as terminal faces may be formed on a substrate having a {111}A face by selecting appropriate growth conditions.

Other Embodiments

In the above embodiments the active layer is pumped by the current injection, but the pumping method is not limited thereto. The pumping can also be effected by introducing pumping light into the active layer from outside.

Further, in the above embodiments, materials of AlGaAs/GaAs series are used, but the material used is not limited thereto. III–V compound semiconductor, such as InGaAsP/InP, GaInP/GaAs and GaInNAs/GaAs, mixed crystal materials formed therefrom, II–VI compound semiconductors, such as ZnSe/GaAs, or mixed crystal materials formed therefrom can be used likewise. Furthermore, a p-type substrate can also be used in the above embodiments.

Further, growth methods, such as MBE and CBE, can be used in place of the MOCVD used in the above embodiments. Furthermore, where the multi-layer mirror is used, the semiconductor multi-layer is used in the above embodiment. However, dielectric multi-layers, such as SiO$_2$/Si, Al$_2$O$_3$/Si and SiO$_2$/TiO$_2$, can be used likewise.

In the above embodiments, tetrahedral structures are adopted, but other polyhedrons, such as a tetrahedral cone, that can provide three-dimensional ring cavities, can also be adopted. The material of the cavity is not limited to semiconductors, and the cavity can be composed of other material, such as organic materials, glass (in this case, a polyhedral glass cavity is disposed on the active medium, for example), and combinations of different materials. The active medium is not likewise limited to semiconductor materials.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A ring cavity laser comprising:
   a ring cavity, said ring cavity having reflective faces formed by a plurality of planes of a polyhedral structure; and
   an active region formed in said ring cavity,
   wherein said ring cavity is constructed such that there exists a three-dimensional light path among light paths of said ring cavity through which light pumped in said active region travels when the light starts at a point on one reflective face, is reflected by each other reflective face and returns to the starting point.

2. A ring cavity laser according to claim 1, said ring cavity being constructed such that light is totally reflected at at least one reflective point of the reflective points in the three-dimensional light path.

3. A ring cavity laser according to claim 1, said ring cavity being constructed such that light is totally reflected at all the reflective points in the three-dimensional light path.

4. A ring cavity laser according to claim 1, said polyhedral structure comprising a tetrahedron.

5. A ring cavity laser according to claim 4, said polyhedral structure comprising a regular tetrahedron.

6. A ring cavity laser according to claim 1, said polyhedral structure being formed of semiconductor.

7. A ring cavity laser according to claim 6, said polyhedral structure being formed of semiconductor of zinc blende type crystalline structure.

8. A ring cavity laser according to claim 6, said semiconductor polyhedral structure including three {111}B faces.

9. A ring cavity laser according to claim 6, said semiconductor polyhedral structure including three {111}A faces.

10. A ring cavity laser according to claim 6, said semiconductor polyhedral structure including three {110} faces.

11. A ring cavity laser according to claim 6, said polyhedral structure being constructed by performing a selective growth on a substrate having a principal plane of a (111)A face, and contoured by semiconductor faces of ($\bar{1}$11)B, (1$\bar{1}$1)B and (11$\bar{1}$)B faces appearing during the selective growth.

12. A ring cavity laser according to claim 6, said polyhedral structure being constructed by performing a selective growth on a substrate having a principal plane of a (111)B face, and contoured by semiconductor faces of ($\bar{1}\bar{1}$1)A, ($\bar{1}$1$\bar{1}$)A and (1$\bar{1}\bar{1}$)A faces appearing during the selective growth.

13. A ring cavity laser according to claim 6, said polyhedral structure being constructed by performing a selective etching of a substrate having a principal plane of a (111)B face, and contoured by semiconductor faces of ($\bar{1}\bar{1}$1)A, ($\bar{1}$1$\bar{1}$)A and (1$\bar{1}\bar{1}$)A faces appearing during the etching process.

14. A ring cavity laser according to claim 6, said polyhedral structure being constructed by performing a selective growth on a substrate having a principal plane of a (111)A face, and contoured by semiconductor faces of (011), (101) and (110) faces appearing during the selective growth.

15. A ring cavity laser according to claim 6, said polyhedral structure being constructed by performing a selective growth on a substrate having a principal plane of a (111)B face, and contoured by semiconductor faces of (0$\bar{1}\bar{1}$), ($\bar{1}0\bar{1}$) and ($\bar{1}\bar{1}$0) faces appearing during the selective growth.

16. A ring cavity laser according to claim 1, at least one reflective face of said ring cavity comprising a multi-layer reflector.

17. A ring cavity laser according to claim 16, at least one reflective face of said ring cavity comprising a semiconductor multi-layer reflector.

18. A ring cavity laser according to claim 16, at least one reflective face of said ring cavity comprising a dielectric multi-layer reflector.

19. A ring cavity laser according to claim 6, further comprising a semiconductor substrate on which said ring cavity is formed, and a buried material with which said reflective faces other than said reflective face on said semiconductor substrate are covered and whose index of refraction is smaller than an index of refraction of said semiconductor of said ring cavity such that a total reflection condition is met.

20. A ring cavity laser according to claim 1, further comprising a semiconductor substrate which has a face inclining toward a predetermined direction by a predetermined angle from one of (111)A and (111)B faces.

* * * * *

UNITED STATES PATENT AND TRADEMARK OFFICE
CERTIFICATE OF CORRECTION

PATENT NO. : 6,282,226 B1
DATED : August 28, 2001
INVENTOR(S) : Yukio Furukawa

It is certified that error appears in the above-identified patent and that said Letters Patent is hereby corrected as shown below:

Column 4,
Line 40, "λis" should read -- λ is --; and

Line 67, "$\exp(-jkL) \cdot \sigma = 1(k = 2N\pi/\lambda)(3)$." should read --
$$\exp(-jkL) \cdot \sigma = 1(K = 2N\pi/\lambda) \qquad (3)$$ --

Column 5,
Line 12, "eigen-vector" should read -- eigenvector --; and
Line 49, "are" should read -- is --.

Column 6,
Line 6, "his" should read -- this --; and
Line 7, "or" should read -- for --.

Signed and Sealed this

Thirteenth Day of August, 2002

Attest:

Attesting Officer

JAMES E. ROGAN
Director of the United States Patent and Trademark Office